(12) United States Patent
Fan et al.

(10) Patent No.: US 8,476,900 B2
(45) Date of Patent: Jul. 2, 2013

(54) ELECTROMAGNETIC DETECTION APPARATUS AND METHODS

(75) Inventors: Xin Fan, Newark, DE (US); John Q. Xiao, Newark, DE (US)

(73) Assignee: University of Delaware, Newark, DE (US)

(*) Notice: Subject to any disclaimer, the term of this patent is extended or adjusted under 35 U.S.C. 154(b) by 575 days.

(21) Appl. No.: 12/779,391

(22) Filed: May 13, 2010

(65) Prior Publication Data

US 2010/0289490 A1   Nov. 18, 2010

Related U.S. Application Data

(60) Provisional application No. 61/178,212, filed on May 14, 2009.

(51) Int. Cl.
*G01R 33/00* (2006.01)
*G01R 33/02* (2006.01)

(52) U.S. Cl.
CPC ..................... *G01R 33/02* (2013.01)
USPC ....................................... 324/260

(58) Field of Classification Search
None
See application file for complete search history.

(56) References Cited

U.S. PATENT DOCUMENTS

| | | | |
|---|---|---|---|
| 4,305,074 A | 12/1981 | Barzana et al. | |
| 5,689,189 A | 11/1997 | Morich | |
| 6,150,045 A * | 11/2000 | Saito et al. | 428/811.2 |
| 6,282,069 B1 * | 8/2001 | Nakazawa et al. | 360/324.2 |
| 6,304,229 B1 | 10/2001 | Lee et al. | |
| 6,380,735 B1 * | 4/2002 | Kawakami | 324/253 |
| 6,875,985 B2 | 4/2005 | Skelton | |
| 7,369,671 B2 * | 5/2008 | Sacha et al. | 381/331 |
| 7,453,412 B2 | 11/2008 | Murali et al. | |
| 7,501,985 B2 | 3/2009 | Qian et al. | |
| 7,978,394 B1 * | 7/2011 | Johnson et al. | 359/282 |
| 2002/0158626 A1 | 10/2002 | Shay | |
| 2007/0052412 A1 | 3/2007 | Desplats | |

FOREIGN PATENT DOCUMENTS

| | | |
|---|---|---|
| EP | 0549911 A1 | 7/1993 |
| EP | 1467218 A2 | 10/2004 |
| JP | 10033497 A | 2/1998 |
| JP | 2007508534 A | 4/2007 |
| KR | 1020090077607 A | 7/2009 |
| WO | WO 2004/028002 | 4/2004 |

OTHER PUBLICATIONS

International Search Report and Written Opinion issued in PCT/US2011/025410, filed Feb. 18, 2011, mailed Oct. 26, 2011.
International Search Report for PCT/US2010/034503 mailed Dec. 29, 2010.
N. Mecking et al., "Microwave photovoltage and photoresistance effects in ferromagnetic microstrips," Physical Review B, vol. 76, 2007.

* cited by examiner

*Primary Examiner* — Paresh Patel
(74) *Attorney, Agent, or Firm* — RatnerPrestia

(57) ABSTRACT

Systems and methods for detecting electromagnetic waves are disclosed. A system for detecting such waves includes a device having a first magnetic layer having a fixed magnetization direction, a second magnetic layer having an unfixed magnetization direction responsive to the electromagnetic wave, and a barrier layer positioned between the first and second magnetic layers. The device may have an impedance dependent on a relative angle between the fixed magnetization direction and the unfixed magnetization direction. The system further has a detector configured to detect a change in the impedance indicative of the electromagnetic wave. The electromagnetic wave may be detected by positioning the device in order to detect the electromagnetic wave, determining a change in the impedance of the device, and detecting the electromagnetic wave based on the change in the impedance of the device. Characteristics of the wave such as frequency, power, and phase may also be detected.

29 Claims, 11 Drawing Sheets

ELECTROMAGNETIC DETECTION APPARATUS AND METHODS

CROSS REFERENCE TO RELATED APPLICATIONS

This application claims the benefit of provisional U.S. patent application No. 61/178,212, filed May 14, 2009.

FIELD OF THE INVENTION

The present invention relates to the field of spintronics and, more particularly, to electromagnetic wave detection systems and methods.

BACKGROUND OF THE INVENTION

Electromagnetic wave detectors are used to detect electromagnetic waves. Conventional detectors make direct use of the electric field portion of the electromagnetic wave for detection. Conventional detectors, however, may have difficulty detecting high power electromagnetic waves and may be bulky.

SUMMARY OF THE INVENTION

Aspects of the present invention are embodied in systems and methods for detecting electromagnetic waves. A system for use in detecting an electromagnetic wave includes a device having a first magnetic layer having a fixed magnetization direction, a second magnetic layer having an unfixed magnetization direction responsive to the electromagnetic wave, and a barrier layer positioned between the first and second magnetic layers. The device has an impedance dependent on a relative angle between the fixed magnetization direction and the unfixed magnetization direction. The relative angle is initially configured to be approximately 90 degrees. The system further has a detector configured to measure a change in the impedance indicative of the electromagnetic wave.

Another aspect of the invention is embodied in a system for use in detecting an electromagnetic wave. The system includes a device having a first magnetic layer having a fixed magnetization direction, a second magnetic layer having an unfixed magnetization direction responsive to the electromagnetic wave, and a barrier layer positioned between the first and second magnetic layers. The device has an impedance dependent on a relative angle between the fixed magnetization direction and the unfixed magnetization direction. The system also includes an external magnetic source for applying a magnetic field to the device. The system further has a detector configured to measure a change in the impedance indicative of the electromagnetic wave.

Yet another aspect of the invention is embodied in a system for use in detecting an electromagnetic wave. The system includes a plurality of devices, each device having a first magnetic layer having a fixed magnetization direction, a second magnetic layer having an unfixed magnetization direction responsive to the electromagnetic wave, and a barrier layer positioned between the first and second magnetic layers. Each device has an impedance dependent on a relative angle between the fixed magnetization direction and the unfixed magnetization direction. The system further includes a receiver for receiving the electromagnetic wave and transmitting the electromagnetic wave to the plurality of devices. The receiver has a plurality of sections corresponding to the plurality of devices. The plurality of sections are configured such that the electromagnetic wave will have a different power density in each section of the receiver. The system further includes a detector configured to detect a change in the impedance of one of the plurality of devices indicative of the electromagnetic wave.

Another aspect of the invention is embodied in a system for use in detecting a phase of a received electromagnetic wave. The system includes a reference electromagnetic wave generator and a device having a first magnetic layer having a fixed magnetization direction, a second magnetic layer having an unfixed magnetization direction at least partially dependent on the received electromagnetic wave and the reference electromagnetic wave, and a barrier layer positioned between the first and second magnetic layers. The device further has an impedance dependent on a relative angle between the fixed magnetization direction and the unfixed magnetization direction. The system also includes a detector configured to detect a change in the impedance of the device indicative of the relative phase of the received electromagnetic wave.

Still another aspect of the invention is embodied in a method for detecting an electromagnetic wave. An electromagnetic wave may be detected by positioning a spintronic device in order to detect the electromagnetic wave, the device having a first magnetic layer having a fixed magnetization direction, a second magnetic layer having an unfixed magnetization direction responsive to the electromagnetic wave, and a barrier layer positioned between the first and second magnetic layers. The device has an impedance dependent on a relative angle between the fixed magnetization direction and the unfixed magnetization direction. The relative angle is initially configured to be approximately 90 degrees. A change in the impedance of the device is then determined. An electromagnetic wave is detected based on the change in the spin property of the device.

Another aspect of the invention is embodied in a method for detecting an electromagnetic wave. An electromagnetic wave may be detected by positioning a spintronic device in order to detect the electromagnetic wave, the device having a first magnetic layer having a fixed magnetization direction, a second magnetic layer having an unfixed magnetization direction responsive to the electromagnetic wave, and a barrier layer positioned between the first and second magnetic layers. The device has an impedance dependent on a relative angle between the fixed magnetization direction and the unfixed magnetization direction. The relative angle is initially configured to be one of approximately 0 degrees and 180 degrees. An external DC magnetic field is applied to the device. The external DC magnetic field is swept to cause the relative angle to switch from the one of approximately 0 degrees and approximately 180 degrees to the other one of approximately 0 degrees and approximately 180 degrees. A change in the impedance of the device adjacent to a switching region of the relative angle is then determined. An electromagnetic wave is detected based on the change in the spin property of the device.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Electrons have both charge and spin properties. The field of electronics is based on the charge property of electrons. The field of spintronics is based on the spin property of electrons. Spintronics generally concerns the detection and/or manipulation of electron spin within a device, which can influence the charge properties of the device. Electron spin is a vector quantity with its direction defined as the direction of magnetization of the electron. There are generally two categories of spin, spin-up and spin-down. Consequently, electrons may be grouped into spin-up and spin-down electrons. Charges or currents having any arbitrary spin direction can be constructed from the combination of these two bases.

In magnetic materials, one type of electron spin may be more common than the other, in which case they are defined as majority and minority spins. In such materials, an electrical current through the material can be thought of as consisting of two parallel channels corresponding to a flow of majority spin and minority spin electrons. When the number of electrons in each channel is different, the overall current carries a net spin direction, termed as spin-polarized current. Additionally, the electrical impedance in the majority spin channel and the minority spin channel may be different. Similarly, these impedances combine to create a separate overall impedance, termed a spin-dependent impedance. As magnetic materials are configured in a multilayer system, the electrical transport properties of the system will depend on the magnetization direction of each magnetic layer. The electrical transport properties of a material or system may include, for example, the electrical current through the system, the impedance of the system, or the voltage across the system. These electrical transport properties may vary depending on the spin of the electrons passing through the magnetic layers, and can therefore also be understood as spin-polarized transport properties. It will be understood that any reference herein to the electrical properties of a device such as current, impedance, or voltage will be referencing the spin-polarized transport properties of the respective material or device, which are dependent on the magnetic properties of the material or device.

As used herein, the term "impedance" refers to the dominant affect, change in impedance and/or resistance, presented by the device. In an exemplary embodiment, where the dominant affect presented by the device is a change in impedance, impedance will be determined, and where the dominant affect presented by the device is resistance, resistance will be determined.

Figure 1A:
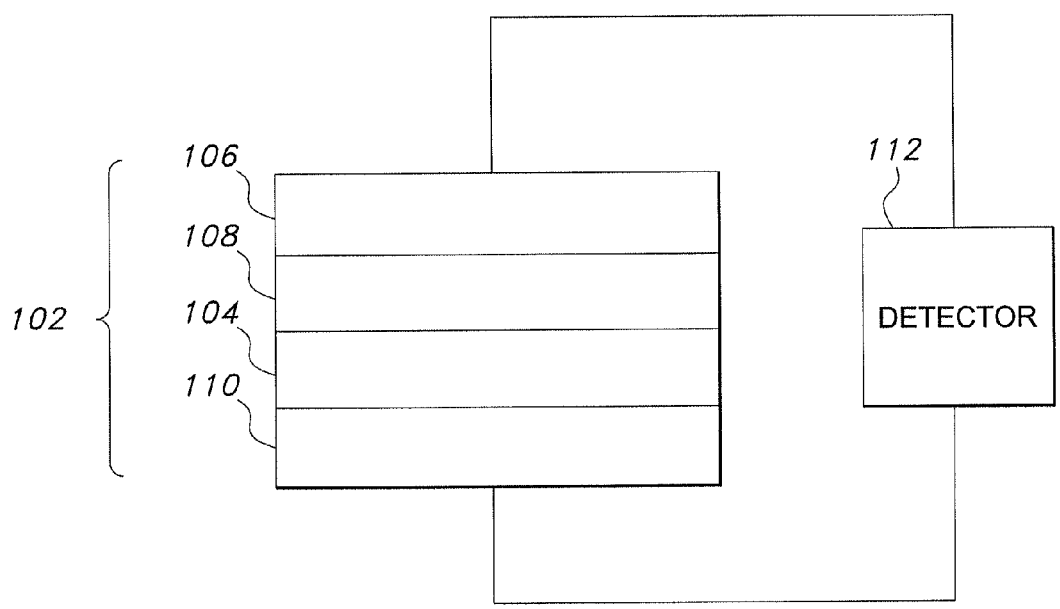
FIG. 1A is a block diagram depicting a system for use in describing exemplary systems and methods for detecting an electromagnetic wave in accordance with aspects of the present invention.

The invention will now be described with reference to the accompanying drawings. FIG. 1A depicts a system 100 for use in describing exemplary systems and methods for detecting an electromagnetic wave in accordance with aspects of the present invention. The electromagnetic wave may optimally be in the microwave range; however, it is contemplated that system 100 may detect electromagnetic radiation outside of the microwave range. As a general overview, system 100 includes a device 102 and a detector 112. The device 102 includes two magnetic layers 104 and 106 and a barrier layer 108. Device 102 may also include a fixing layer 110. Additional details of system 100 are provided below.

Magnetic layers 104 and 106 are layers of magnetic material. In an exemplary embodiment, magnetic layers 104 and 106 are formed from ferromagnetic material. However, it is contemplated that magnetic layers 104 and 106 may be formed from other magnetic materials including, for example, ferrimagnetic materials, antiferromagnetic materials, or a combination of magnetic materials. Suitable magnetic materials for magnetic layers 104 and 106 may include, for example, at least one of the elements Ni, Fe, Mn, Co, or their alloys, or half-metallic ferromagnets such as NiMnSb, PtMnSb, $Fe_3O_4$, or $CrO_2$. Other suitable magnetic materials for magnetic layers 104 and 106 will be understood by one of ordinary skill in the art from the description herein.

Barrier layer 108 is positioned between magnetic layers 104 and 106. In an exemplary embodiment, barrier layer 108 is formed from an insulating material such as, for example, an oxide or nitride of one or more of Al, Mg, Si, Hf, Sr, Zn, Zr, or Ti. In another exemplary embodiment, barrier layer 108 may be formed from conducting materials. Such conducting materials may allow electrons to easily pass from one magnetic layer to the other. Suitable conducting materials for barrier layer 108 will be understood by one of ordinary skill in the art from the description herein.

Fixing layer 110 may be positioned adjacent magnetic layer 104. In an exemplary embodiment, fixing layer 110 fixes the magnetization direction of magnetic layer 104. Fixing layer 110 may consist of a single layer of material or may consist of a stack of layers of one or more materials, as would be know to one of ordinary skill in the art. Fixing layer 110 may optimally be formed from antiferromagnetic or ferromagnetic materials such as, for example, FeMn, NiMn, FeNiMn, FeMnRh, RhMn, CoMn, CrMn, CrMnPt, CrMnRh, CrMnCu, CrMnPd, CrMnIr, CrMnNi, CrMnCo, CrMnTi, PtMn, PdMn, PdPtMn, IrMn, NiO, CoO, SmCo, NdFeB, FePt, or a combination of these materials, which fix the magnetization direction of magnetic layer 104. Other suitable materials for fixing layer 110 will be understood by one of ordinary skill in the art from the description herein.

Device 102 has an associated impedance dependent on layers 104-110 of device 102. In an exemplary embodiment, the impedance of device 102 is dependent on the magnetization directions of magnetic layers 104 and 106. Magnetic layers 104 and 106 each have an associated magnetization direction (depicted by arrows in FIGS. 1B-1C). In an exemplary embodiment, the magnetization direction of magnetic layer 104 is fixed in a single direction and the magnetization direction of magnetic layer 106 is unfixed, or free.

Figure 1B:
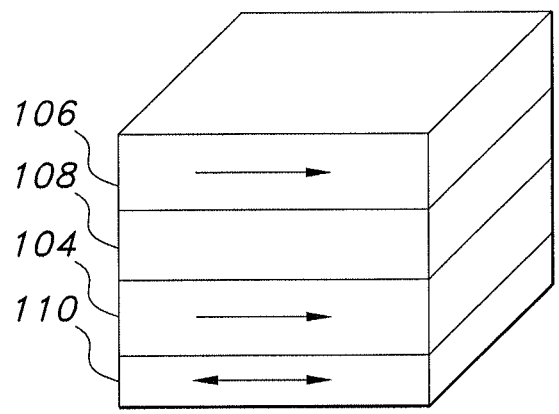
FIGS. 1B and 1C are diagrams depicting exemplary embodiments of devices for use with the system of FIG. 1A.
Figure 1C:
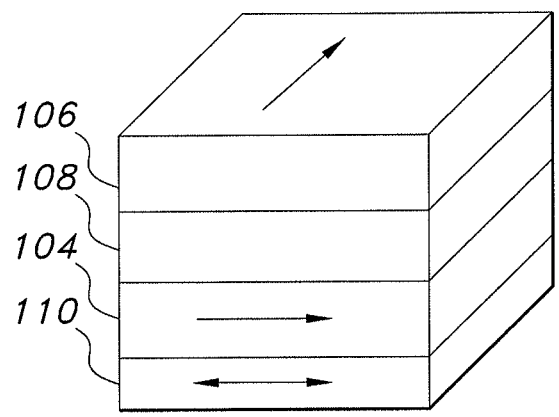

The magnetization direction of magnetic layer 104 may be fixed by positioning fixing layer 110 adjacent magnetic layer 104. The unfixed magnetization direction of magnetic layer 106 may be configured to initially have a given direction relative to the fixed magnetization direction of magnetic layer 104. For example, the initial magnetization direction of magnetic layer 106 may be parallel to the magnetization direction of magnetic layer 104, as depicted in FIG. 1B. Alternatively, the initial magnetization of magnetic layer 106 may be perpendicular to the magnetization direction of magnetic layer 104, as depicted in FIG. 1C. In either configuration, however, the unfixed magnetization direction of magnetic layer 106 may be free to rotate away from the initially configured direction, e.g., through a full 360°. The initial magnetization direction of magnetic layer 106 may be selected by applying an external DC magnetic field to device 102 in the desired direction of the unfixed magnetization. The external DC magnetic field may be generated by an external electromagnet or by a DC current adjacent device 102.

Figure 1D:
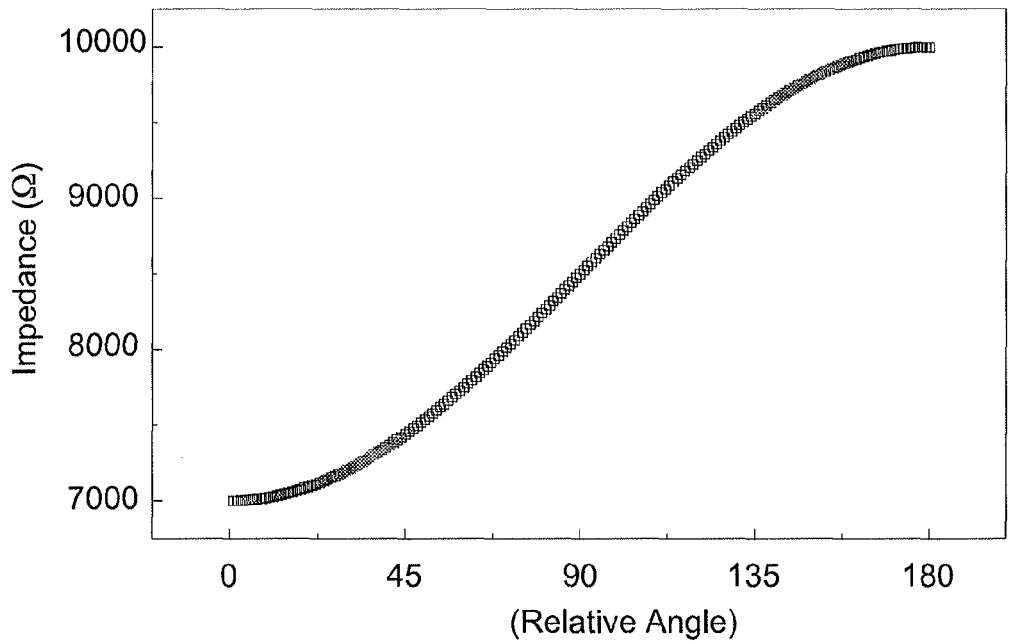
FIG. 1D is a graph of magnitude of impedance for the system of FIG. 1A.

The impedance of device 102 is dependent on a relative angle between the magnetization directions of magnetic layers 104 and 106. FIG. 1D depicts a graph of impedance of exemplary device 102 based on the relative angle between the magnetization directions of magnetic layers 104 and 106. In an exemplary embodiment, the magnitude of impedance of device 102 is lowest when the relative angle between the fixed magnetization direction and the unfixed magnetization direction is 0°, i.e., when the directions are parallel. The magnitude of impedance of device 102 is highest when the relative angle between the fixed magnetization and the unfixed magnetization is 180°, i.e., when the directions are antiparallel, or opposite.

The magnetization direction of magnetic layer 106 is at least partially dependent on a magnetic field received by device 102. Accordingly, as will be discussed in greater detail below, exposure of layer 106 to an electromagnetic wave, which will have electric and magnetic field portions, may cause the magnetization direction of magnetic layer 106 to change. A change in the unfixed magnetization direction of magnetic layer 106 causes a change in the relative angle, which in turn changes the impedance of device 102. Accordingly, the impedance of device 102 may change when exposed to a magnetic field, and therefore is at least partially dependent on a received electromagnetic wave.

Although device 102 illustrates layers 104-110 having the same width, it is contemplated that any of the layers of device 102 could be wider or narrower as necessary to optimize the impedance and magnetization orientation of device 102. In a preferred embodiment, device 102 is a spintronic device having a relatively large magnetoimpedance (e.g., greater than 5%), including, for example, a magnetic tunnel junction or a spin valve. However, device 102 may be any suitable spintronic device. Suitable devices 102 for use with the present invention will be understood by one of skill in the art from the description herein.

Detector 112 measures the voltage across device 102. In an exemplary embodiment, detector 112 is a voltage detector such as, for example, a lock-in amplifier. However, detector 112 may be any suitable voltage detector. The voltage measured by detector 112 is dependent on the impedance of device 102. As described above, exposure to an electromagnetic wave may change the impedance of device 102. Accordingly, system 100 may detect an electromagnetic wave based on a change in the impedance of device 102 which is reflected in a change in the voltage measured by detector 112. A suitable voltage detector will be known to one of ordinary skill in the art from the description herein.

The interaction between an electromagnetic wave and the unfixed magnetization direction will now be described. In an exemplary embodiment, the free magnetic layer is sensitive to ferromagnetic resonance. This means that, when exposed to an electromagnetic wave, the unfixed magnetization direction precesses in response to the magnetic field portion of the electromagnetic wave. The free magnetic layer has a specific ferromagnetic resonant frequency at which the unfixed magnetization direction experiences the largest angle of precession. This frequency may be located in the microwave range.

The angle of precession of the unfixed magnetization direction is dependent on the magnetic field portion and the frequency of the electromagnetic wave. For example, as the magnitude of the magnetic field portion of the electromagnetic wave increases, the angle of precession of the magnetization direction increases. For another example, as the frequency of the electromagnetic wave approaches the ferromagnetic resonant frequency of the magnetic layer, the angle of precession of the magnetization direction also increases. In a configuration where the fixed and unfixed magnetic layers are initially configured to a specific relative angle (e.g., parallel or perpendicular), exposure to an electromagnetic wave may cause the relative angle between the fixed and unfixed magnetization directions to precess around the pre-configured angle. Precession of the relative angle thereby causes a change in the impedance of the device, which can be measured by a suitable voltage detector. This allows an exemplary device of the present invention to convert a received electromagnetic wave into a voltage signal which can be measured with a detector.

Figure 2:
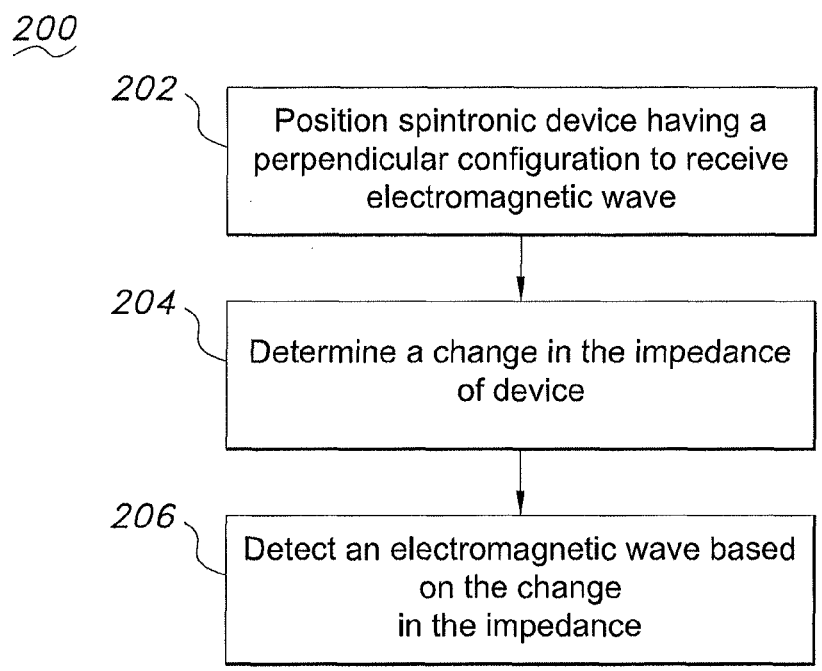
FIG. 2 is a flow chart of exemplary steps for detecting an electromagnetic wave in accordance with an aspect of the present invention.

FIG. 2 is a flow chart 200 depicting exemplary steps for detecting an electromagnetic wave in accordance with an aspect of the present invention. To facilitate description, the steps of FIG. 2 are described with reference to the system components of FIG. 1. It will be understood by one of skill in the art from the description that different components may be utilized without departing from the scope of the present invention.

In step 202, a spintronic device is positioned to receive an electromagnetic wave. In an exemplary embodiment, device 102 is positioned to receive an electromagnetic wave. As described above, device 102 has an impedance that is at least partially dependent on the relative angle between the fixed and unfixed magnetization directions of layers 104 and 106. The relative angle between the fixed and unfixed magnetization directions may be initially configured to be 90°, which may provide advantages that will be discussed herein. When device 102 receives an electromagnetic wave, the unfixed magnetization direction precesses, causing a change in the relative angle and a change in the impedance of device 102.

In step 204, a change in the impedance of the device is determined. In an exemplary embodiment, the impedance of device 102 combines with a current to generate a voltage across device 102. Detector 112 measures the voltage across device 102. Any change in the voltage measured across device 102 corresponds to a change in impedance of device 102.

In step 206, an electromagnetic wave is detected. In an exemplary embodiment, a change in the voltage measured by detector 112 corresponds to a change in the impedance of device 102. The change in impedance is caused by exposure to an electromagnetic wave. Thus, a change in the voltage across device 102 indicates the detection of an electromagnetic wave. Additional characteristics of the wave, such as power, frequency, and/or phase, may further be determined from the change in voltage measured by detector 112, as will be described in further detail below.

Figure 3A:
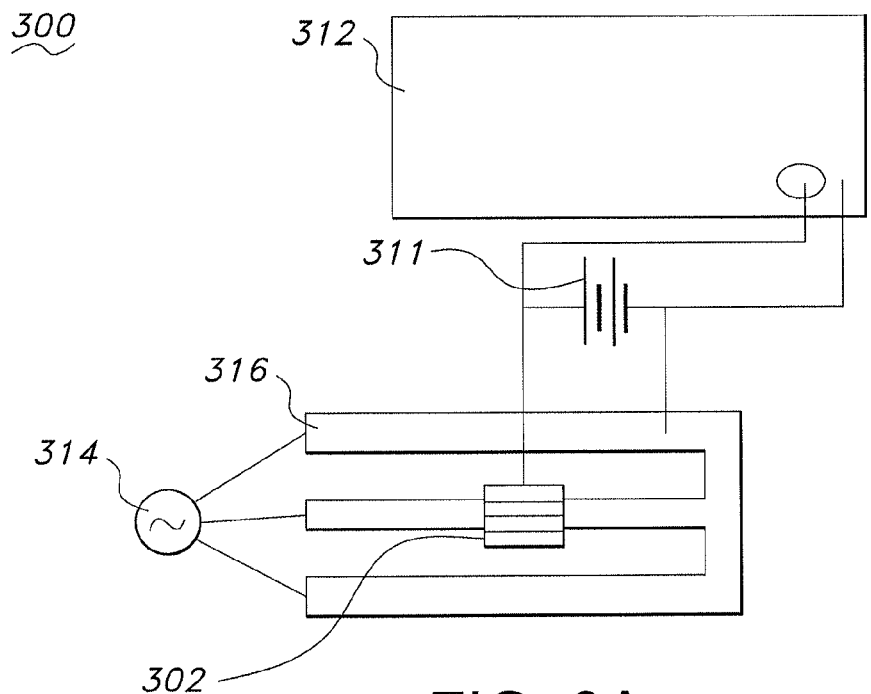
FIG. 3A is a diagram depicting another exemplary system for detecting an electromagnetic wave in accordance with an aspect of the present invention.

FIG. 3A depicts an exemplary system 300 for detecting an electromagnetic wave in accordance with an aspect of the present invention. As a general overview, system 300 includes a device 302, a current source 311, a detector 312, and an electromagnetic wave source 314. System 300 may further include a receiver 316. System 300 may be configured to detect electromagnetic waves having frequencies far below the ferromagnetic resonant frequency of device 302. Additional details of system 300 are provided below.

Device 302 is a spintronic device substantially as described above with respect to device 102. Device 302 includes a first magnetic layer having a fixed magnetization direction and a second magnetic layer having an unfixed magnetization direction. Device 302 includes a barrier layer positioned between the two magnetic layers. Device 302 may further include a fixing layer to fix the magnetization direction of one of the magnetic layers. Device 302 has an impedance dependent at least in part on a relative angle between the magnetization directions of the two magnetic layers.

The magnetization directions of device 302 are configured to be either parallel or antiparallel. Accordingly, in one exemplary embodiment of device 302, the initial unfixed magnetization direction is oriented in the same direction as the fixed magnetization direction, and the relative angle between the fixed and unfixed magnetization directions is approximately 0°. In another exemplary embodiment of device 302, the initial unfixed magnetization direction is oriented in the opposite direction of the fixed magnetization direction, and the relative angle between the fixed and unfixed magnetization directions is 180°.

Current source 311 is configured to provide a current through device 302. In an exemplary embodiment, current source 311 is a constant direct-current (DC) source. A suitable current source for use with the present invention will be understood by one of skill in the art.

Detector 312 measures the voltage across device 302. In an exemplary embodiment, detector 312 is a voltage detector such as, for example, a lock-in amplifier. However, detector 312 may be any suitable voltage detector. The voltage measured by detector 312 results from the impedance of device 302 combined with the current provided by current source 311. As described above, exposing device 302 to an electromagnetic wave may change the impedance of device 302. Accordingly, system 300 may detect an electromagnetic wave based on a change in the impedance of device 302 which is reflected in the voltage measured by detector 312. A suitable voltage detector will be known to one of ordinary skill in the art from the description herein.

Electromagnetic wave source 314 emits electromagnetic waves. Electromagnetic wave source 314 may optimally emit electromagnetic radiation in the microwave range; however, it is contemplated that electromagnetic wave source 314 may emit other electromagnetic radiation. Detector 302 is exposed to the electromagnetic waves emitted by source 314. In an exemplary embodiment, electromagnetic waves from source 314 cause the unfixed magnetization direction of the free magnetic layer to precess. Precession of the unfixed magnetization direction causes the relative angle of the fixed and unfixed magnetizations of device 302 to precess around either 0° or 180°. Correspondingly, precession of the relative angle causes a change in the impedance of device 302 responsive to receiving the electromagnetic waves from source 314. Electromagnetic wave source 314 may be any source of electromagnetic radiation desired to be detected.

Receiver 316 may be used to receive electromagnetic waves from electromagnetic wave source 314 and to transmit them to device 302. Receiver 316 may be coupled to device 302 such that receiver 316 focuses the magnetic field portion of the received electromagnetic waves on device 302. In an exemplary embodiment, receiver 316 may be a waveguide such as a shorted coplanar waveguide. However, receiver may be any waveguide or antenna suitable for receiving electromagnetic waves from source 314 and transmitting them to device 302. A suitable receiver 316 for use with the present invention will be understood by one of skill in the art from the description herein.

Figure 3B:
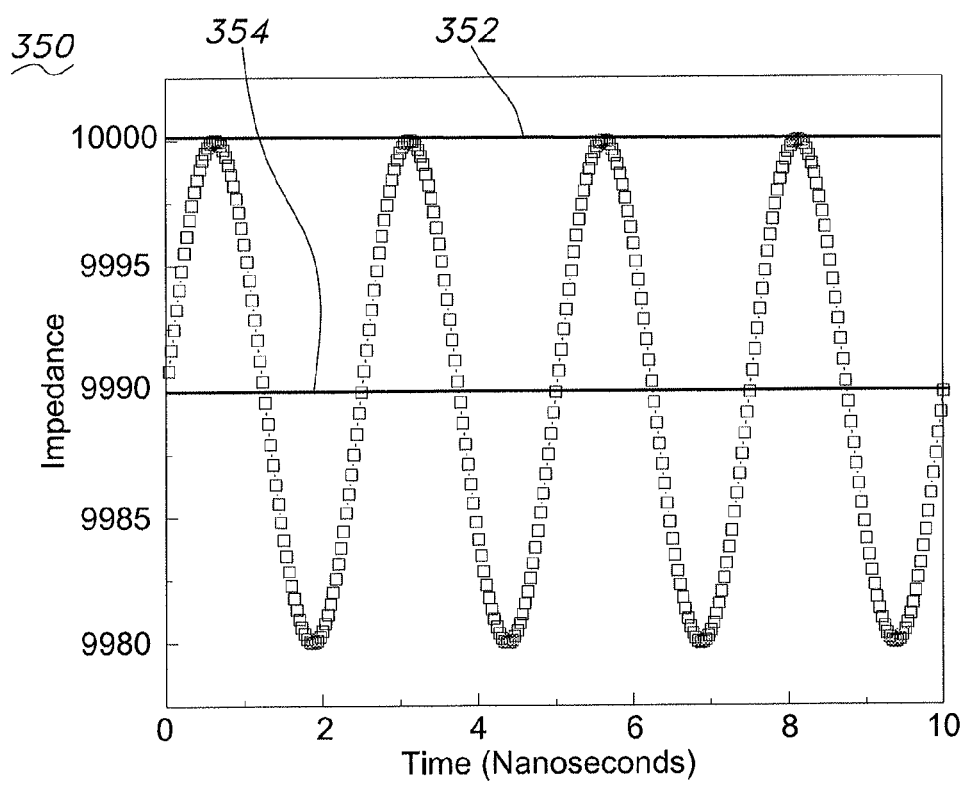
FIG. 3B is a graph of magnitude of impedance of an exemplary embodiment of the system of FIG. 3A.

FIG. 3B depicts a graph 350 of the impedance of exemplary device 302 as a function of time. As described above, device 302 has a maximum impedance when the relative angle between the fixed and unfixed magnetization directions is 180°. Device 302 is depicted having a maximum impedance of 10,000Ω, as shown by line 352 of graph 350. As disclosed above, when an electromagnetic wave is applied to device 302, the unfixed magnetization direction precesses from the antiparallel configuration, causing the relative angle to precess back and forth around 180°. Because the maximum relative angle is 180°, precession periodically decreases the relative angle, which periodically lowers the impedance of device 302. FIG. 3B depicts the periodic lowering of impedance of device 302 caused by the electromagnetic wave. In this configuration, the average impedance of device 302 becomes 9,900Ω, as shown by line 354 of graph 350.

Referring back to FIG. 3A, the change in impedance combines with the current from current source 311 to generate a change in voltage. Detector 112 measures this change in voltage across device 302. Accordingly, exposure to an electromagnetic wave may cause a change in voltage across device 302. Measurement of such a change in voltage by detector 312 indicates the detection of an electromagnetic signal by system 300.

System 300 may also be configured to determine characteristics of the electromagnetic wave based on the voltage measured by detector 312. For example, system 300 may be configured to determine the frequency of the received electromagnetic wave. In an exemplary embodiment, the frequency of precession of the relative angle of device 302, and correspondingly the frequency of the change in impedance of device 302, is dependent on the frequency of the electromagnetic wave. Accordingly, the frequency of the electromagnetic wave may be proportional to the frequency of the voltage change measured by detector 312. By measuring the frequency of the voltage, the frequency of the electromagnetic wave may thereby be determined.

In an alternative embodiment, the frequency of the magnetic wave may be determined by measuring the voltage measured by detector 312 as a function of an externally applied DC magnetic field. An external DC magnetic field may be applied from an electromagnetic or current adjacent device 302 (not shown). Applying a DC magnetic field to device 302 may change the ferromagnetic resonant frequency of the unfixed magnetic layer. The resonance frequency of the unfixed magnetic layer is equal to:

$$f = \gamma \sqrt{(H_{dc}+H_{an})(H_{dc}+H_{an}+M_s)}$$

where $\gamma$ is the gyromagnetic ratio, $H_{dc}$ is the applied DC magnetic field, $H_{an}$ is the anisotropy field, and $M_s$ is the saturation magnetization. The values of $\gamma$, $H_{an}$ and $M_s$ all depend on the magnetic material used in the unfixed magnetic layer and may be predetermined. Therefore, the applied DC magnetic field, $H_{dc}$, may be swept to tune the ferromagnetic resonant frequency to match the frequency of the electromagnetic wave. As described above, when the electromagnetic wave frequency and the ferromagnetic resonant frequency match, the magnetic field portion of the electromagnetic wave will precess the unfixed magnetization with a maximum angle, thereby causing the largest change in impedance of device 302. To determine the frequency of the electromagnetic wave, one may sweep the applied DC magnetic field and observe the field $H_{dc}$ that produces the largest voltage change measured by detector 312, which corresponds to the largest impedance change of device 302. The frequency may then be determined using value of $H_{dc}$ at which the largest impedance change occurs.

Additionally, system 300 may be configured to determine the power of the received electromagnetic wave. In an exemplary embodiment, the magnitude of the precession of the relative angle of device 302, and correspondingly the magnitude of the change in impedance of device 302, is dependent on the power of electromagnetic wave. Specifically, the magnitude of the change in impedance may be proportional to the square root of the power of the electromagnetic wave. Accordingly, the power of the electromagnetic wave may be proportional to the magnitude of the voltage measured by detector 312. By measuring the magnitude of the voltage, and thereby the magnitude of the change in impedance, the power of the electromagnetic wave may be determined.

System 300 may also be configured as an electromagnetic wave demodulator. In an exemplary embodiment, the electromagnetic wave received from source 314 may be an AC signal wave modulating a high frequency electromagnetic carrier wave, i.e. a microwave carrier. By applying a current from current source 311, the change in impedance of device 302 will result in a change in voltage. This change in voltage may be proportional to the AC signal modulated by the electromagnetic wave. For amplitude modulation, detector 312 may employ a low-pass filter to filter out the electromagnetic carrier wave. In this case, the voltage measured by detector 312 may be proportional to the DC current from current source 311, the AC signal from the wave, and harmonics. The AC signal may then be extracted. A similar technique may be used to extract an AC signal from a frequency modulated or phase modulated electromagnetic wave.

Figure 3C:
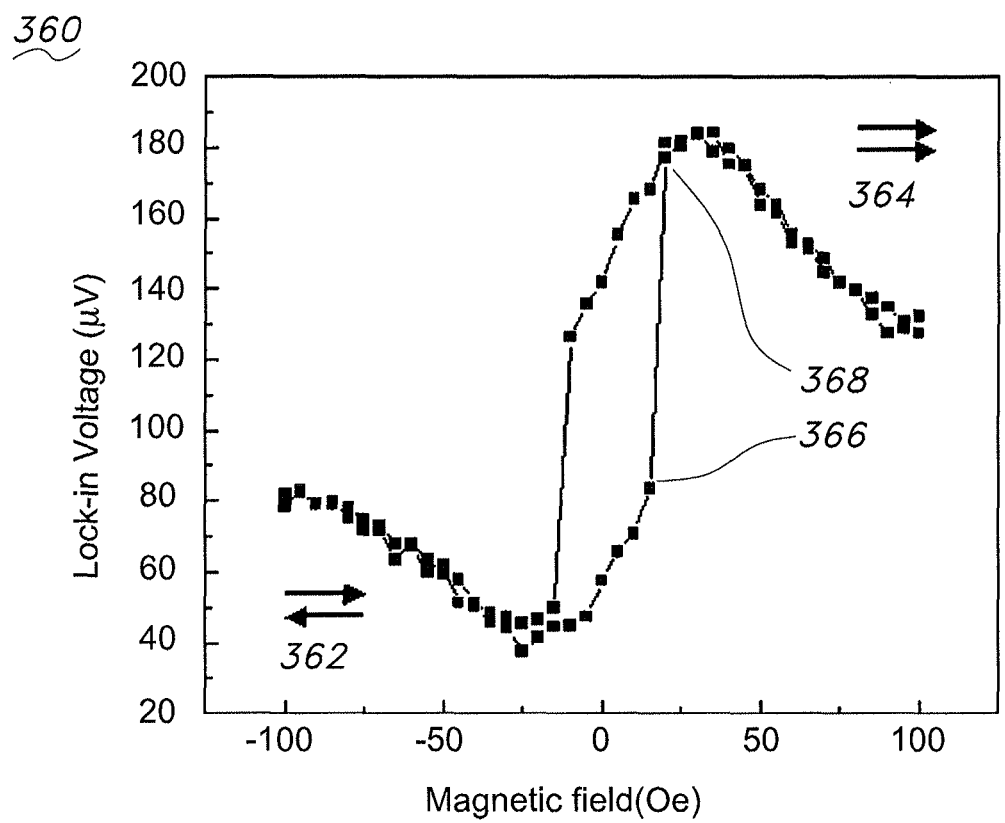
FIG. 3C is a graph of the voltage measured across an exemplary embodiment of the system of FIG. 3A.

System 300 may further be specially configured to detect the power of electromagnetic waves having a frequency lower than the ferromagnetic resonant frequency of the unfixed magnetization direction. FIG. 3C is a graph 360 of voltage measured across exemplary device 302 as a function of an applied external magnetic field strength. In an exemplary embodiment, an external DC magnetic field is applied to device 302, as described above. The external DC magnetic field may be produced by an electromagnet or external current adjacent the device (not shown). When the external magnetic field is swept from negative to positive strength, the unfixed magnetization direction may switch between the antiparallel and the parallel configuration (as indicated by arrow sets 362 and 364). In the parallel configuration, the measured voltage can be expressed as $V_b + a\chi_p^2(H_p)h_{rf}^2$, where $V_b$ is the background signal, a is a coefficient, $\chi_p(H_p)$ is the susceptibility of the unfixed magnetic layer of the device in the parallel configuration, and $h_{rf}$ is the magnetic field portion of the electromagnetic wave. Similarly, the measured voltage in the antiparallel configuration can be expressed as $V_b - a\chi_{ap}^2(H_{ap})h_{rf}^2$, where $\chi_{ap}(H_{ap})$ is the susceptibility of the unfixed magnetic layer of the device in the antiparallel configuration. The voltage difference between the parallel and the antiparallel configuration ($\Delta V$) can thus written as $a[\chi_p^2(H_p)+\chi_{ap}^2(H_{ap})]h_{rf}^2$. Therefore, the value of $\Delta V$ can be used to determine the power of the electromagnetic wave. In a preferred embodiment, the value of $\Delta V$ may be obtained by measuring the voltage across device 302 directly adjacent to the location where the external magnetic field causes the device to switch from parallel to antiparallel, or vice versa (the switching region). This measurement of $\Delta V$ is illustrated between points 366 and 368 in FIG. 3C. This configuration may be particularly useful for detecting low frequency electromagnetic waves (e.g., from approximately 100 Hz to 500 MHz). However, for electromagnetic waves having frequencies closer to the ferromagnetic resonant frequency, detection may be preferable using the ferromagnetic resonance effect, as described above.

Figure 4A:
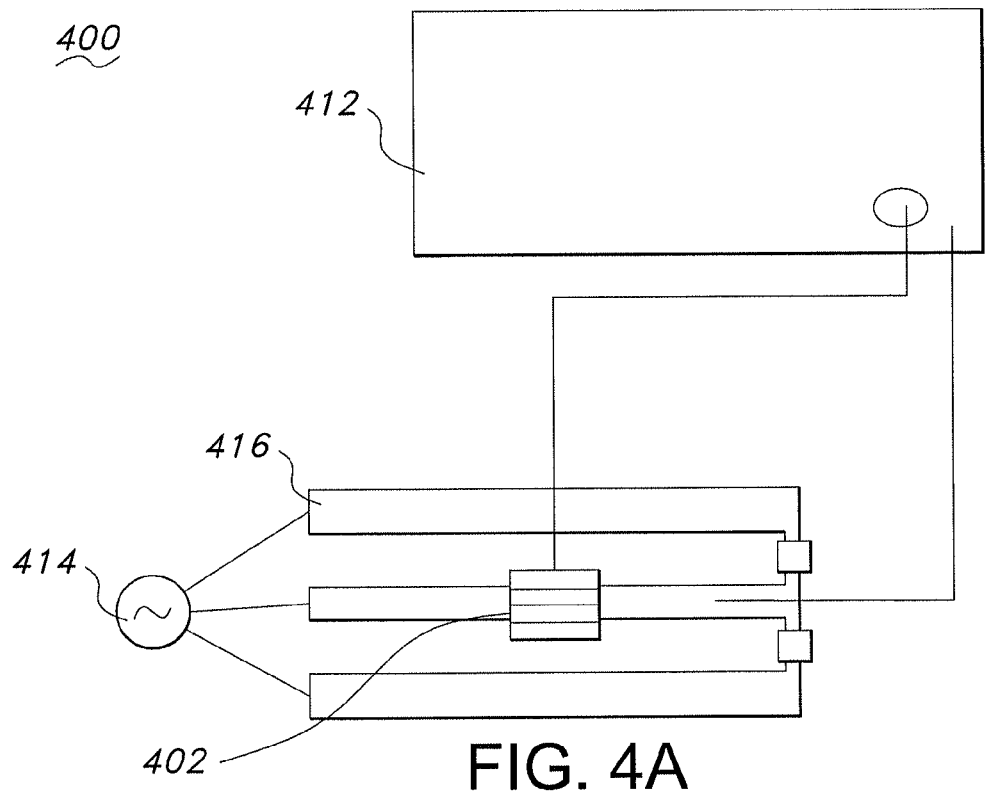
FIG. 4A is a diagram depicting yet another exemplary system for detecting an electromagnetic wave in accordance with an aspect of the present invention.

FIG. 4A depicts another exemplary system 400 for detecting an electromagnetic wave in accordance with an aspect of the present invention. As a general overview, system 400 includes a device 402, a detector 412, and an electromagnetic wave source 414. System 400 may further include a receiver 416. Additional details of system 400 are provided below.

Device 402 is a spintronic device substantially as described above with respect to device 102. Device 402 includes a first magnetic layer having a fixed magnetization direction and a second magnetic layer having an unfixed magnetization direction. Device 402 includes a barrier layer positioned between the two magnetic layers. Device 402 may further include a fixing layer to fix the magnetization direction of one of the magnetic layers. Device 402 has an impedance dependent at least in part on a relative angle between the magnetization directions of the two magnetic layers.

The magnetization directions of the first and second magnetic layers of device 402 are configured to be perpendicular to one another. Accordingly, in an exemplary embodiment of device 402, the unfixed magnetization direction is initially configured to be at a right angle to the fixed magnetization direction, such that the relative angle between the fixed and the initial unfixed magnetization directions is approximately 90°.

As will be described in greater detail below, system 400 may operate without the need for an external current source, as provided in system 300. Accordingly, system 400 may be a passive system. However, it is contemplated that system 400 may also include a current source similar to current source 311 described above with respect to system 300. When coupled with a current source, it is contemplated that system 400 would function similar to system 300, as described above.

Detector 412 measures the voltage across device 402. In an exemplary embodiment, detector 412 is a voltage detector such as, for example, a lock-in amplifier. However, detector 412 may be any suitable voltage detector. The voltage measured by detector 412 is dependent on the impedance of device 402. As described above, exposure to an electromagnetic wave may change the impedance of device 402. Additionally, as will be described, exposure of device 402 to an electromagnetic may induce a current in device 402. Accordingly, system 400 may detect an electromagnetic wave based on a change in the impedance of device 402 which is reflected in the voltage measured by detector 412. A suitable voltage detector will be known to one of ordinary skill in the art from the description herein.

Electromagnetic wave source 414 emits electromagnetic waves. Electromagnetic wave source 414 may optimally emit electromagnetic radiation in the microwave range; however, it is contemplated that electromagnetic wave source 414 may emit other electromagnetic radiation. Detector 402 is exposed to the electromagnetic waves emitted by source 414. In an exemplary embodiment, electromagnetic waves from source 414 cause the unfixed magnetization direction to precess. Precession of the unfixed magnetization direction causes the relative angle of the fixed and unfixed magnetizations of device 402 to precess around 90°. Precession of the relative angle causes a change in the impedance of device 402 responsive to the electromagnetic waves from source 414. Electromagnetic wave source 414 may be any source of electromagnetic radiation desired to be detected.

Receiver 416 may be used to receive electromagnetic waves from electromagnetic wave source 414 and to transmit them to device 402. Receiver 416 may be coupled to device 402 in order to focus the magnetic field portion of the received electromagnetic waves on device 402. In an exemplary embodiment, receiver 416 may be a waveguide such as a loaded coplanar waveguide. However, receiver may be any waveguide or antenna suitable for receiving electromagnetic waves from source 414 and transmitting them to device 402. A suitable receiver 416 for use with the present invention will be understood by one of skill in the art from the description herein.

Figure 4B:
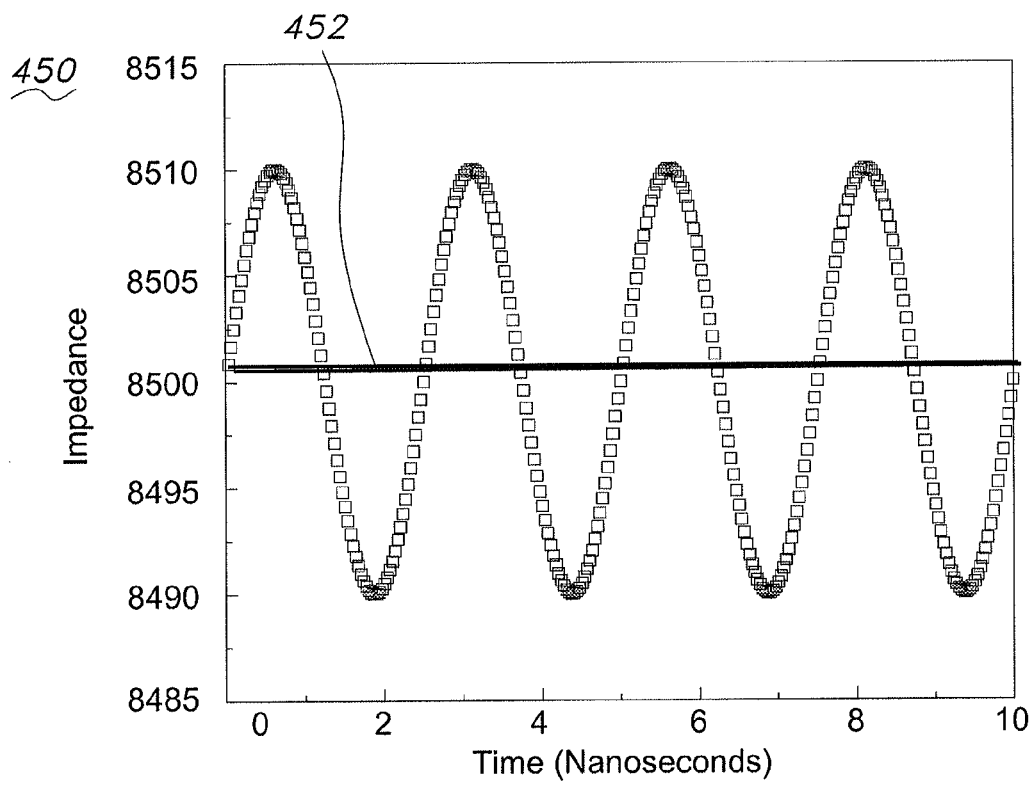
FIG. 4B is a graph of magnitude of impedance of an exemplary embodiment of the system of FIG. 4A.

FIG. 4B depicts a graph 450 of the impedance of exemplary device 402 as a function of time. Device 402 is depicted as having an impedance of 8,500Ω at a relative angle of 90°, as shown by line 452 of graph 450. When an electromagnetic wave is applied to device 402, the unfixed magnetization direction precesses from the perpendicular configuration, causing the relative angle to precess back and forth around 90°. As the relative angle periodically raises and lowers, the impedance of device 402 similarly raises and lowers. FIG. 4B depicts the periodic raising and lowering of the impedance of device 402 caused by the electromagnetic wave. In this configuration, the precession does not change the average impedance of device 402.

The electromagnetic wave received by device 402 generates both electric and magnetic fields. As described above, the magnetic field portion of the electromagnetic wave may cause precession of the unfixed magnetization direction, thereby causing a change in the impedance of device 402. Additionally, the electric field portion of the electromagnetic wave may induce a current in device 402. The changing impedance and the induced current may then generate a voltage across device 402. Accordingly, voltage across device 402 may be generated without the need for an external current source, as described in system 300.

Figure 4C:
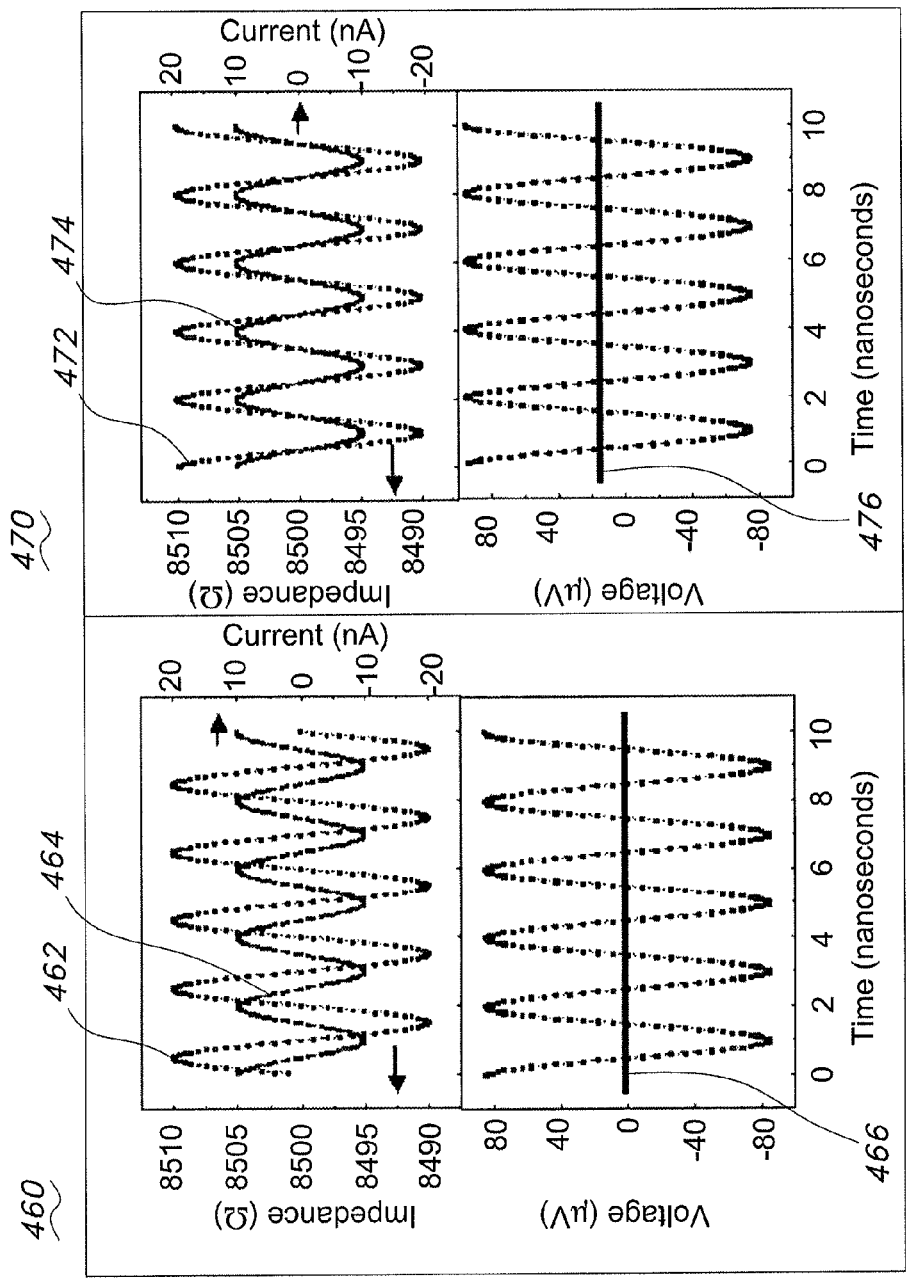
FIG. 4C is a graph of the electrical properties of an exemplary embodiment of the system of FIG. 4A.

FIG. 4C depicts graphs 460 and 470 of the change in impedance, induced current, and induced voltage across device 402. Specifically, graph 460 corresponds to the exposure of device 402 to an electromagnetic wave having a frequency substantially different from the ferromagnetic resonance of the unfixed magnetic layer (off-resonance), while graph 470 corresponds to the exposure of device 402 to an electromagnetic wave having a frequency the same as the ferromagnetic resonant frequency of the unfixed magnetic layer (on-resonance). In the off-resonance configuration, the magnitude of the change in impedance 462 caused by the magnetic field portion is comparatively low (e.g., 20Ω). Additionally, the change in impedance 462 is out of phase with the current 464 induced by the electric field portion. Accordingly, no voltage 466 is induced across device 402. In the on-resonance configuration, the magnitude of the change in impedance 472 caused by the magnetic field portion is comparatively high. Additionally, the change in impedance 472 is in phase with the current 474 induced by the electric field portion. Accordingly, a non-zero voltage 476 is induced across device 402. As detector 412 measures the voltage across device 402, a measurement of non-zero voltage indicates the detection of an electromagnetic signal.

Referring back to FIG. 4A, system 400 may also be configured to determine characteristics of the electromagnetic wave based on the voltage measured by detector 412. System 400 may be used to determine the frequency and/or power of the received electromagnetic wave using the steps described above with respect to system 300. Similarly, system 400 may be configured as an electromagnetic wave demodulator using the steps described above with respect to system 300.

System 400 may further be configured as an electromagnetic wave modulator or amplifier. In an exemplary embodiment, a current source similar to current source 311 may be added to system 400. To function as a modulator, the current source may apply an alternating current (AC) through device 402. This current combines with the impedance of device 402 to create an output voltage across device 402. The voltage measured by detector 412 may be in the form of a modulated electromagnetic wave, with the AC signal from the current device modulating the received electromagnetic wave. To function as an amplifier, the current source may apply a direct current (DC) through device 402. This current combines with the impedance of device 402 to create an output voltage across device 402. The output voltage measured by detector 412 will have the same frequency of the received electromagnetic wave, amplified by the application of the DC current.

System 400 may also be configured to detect the relative phase between the electric field portion and the magnetic field portion of the electromagnetic wave. In an exemplary embodiment, a sweeping external DC magnetic field is applied to device 402, as described above. Detector 412 may then measure the spectrum of voltage resulting from the magnetic field sweep. The relative phase between the electric field portion and magnetic field portions of the electromagnetic wave will result in a relative phase between the induced current and impedance of device 402. The relative phase between the induced current and the impedance may be reflected in the voltage spectrum measured by detector 412, i.e. a specific profile of the field-swept voltage spectrum may correspond to a relative phase of the electromagnetic wave. Accordingly, the relative phase of the received electromagnetic wave may be discerned from the voltage spectrum measured during the sweep of the external DC magnetic field. Determination of the relative phase from this voltage spectrum will be understood by one of skill in the art from the description herein.

Figure 5A:
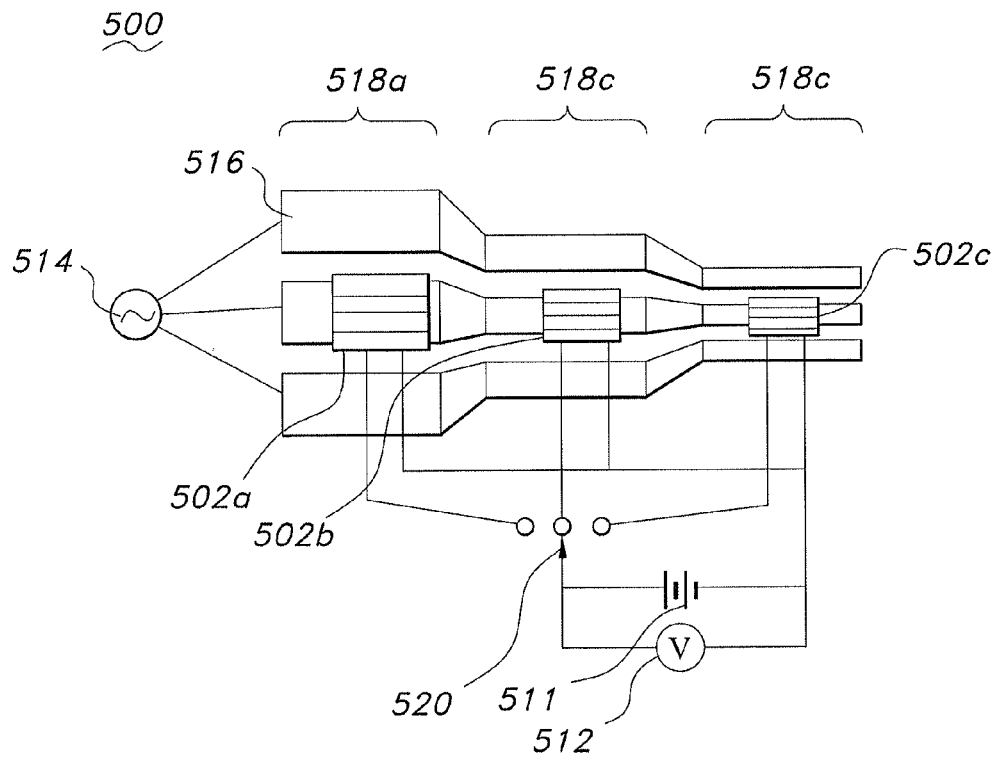
FIG. 5A is a diagram depicting an exemplary system for detecting an electromagnetic wave in accordance with another aspect of the present invention.

FIG. 5A depicts an exemplary system 500 for detecting an electromagnetic wave in accordance with another aspect of the present invention. System 500 is configured to detect electromagnetic waves over a wider range of power. As a general overview, system 500 includes devices 502a-502c, a current source 511, a detector 512, an electromagnetic wave source 514, and a receiver 516. Additional details of system 500 are provided below.

Devices 502a-502c are spintronic devices substantially as described above with respect to device 102. The fixed magnetization direction and unfixed magnetization direction of devices 502a-502c may be configured to either be parallel/antiparallel or perpendicular, as described above. The impedance of devices 502a-502c are changed by exposure to an electromagnetic wave. While FIG. 5A depicts three devices, it is contemplated that any number of devices 502 may be used to achieve a wider range of electromagnetic wave detection.

Current source 511 is configured to provide a current through devices 502a-502c. Detector 512 measures the voltage across devices 502a-502c. System 500 may detect an electromagnetic wave based on a change in the impedance of devices 502a-502c which is reflected in the voltage measured by detector 512. Electromagnetic wave source 514 emits the electromagnetic waves to be detected, as described above. Electromagnetic wave source 514 may optimally emit microwave radiation, however, it is contemplated that source 514 may emit other electromagnetic radiation.

Figure 5B:
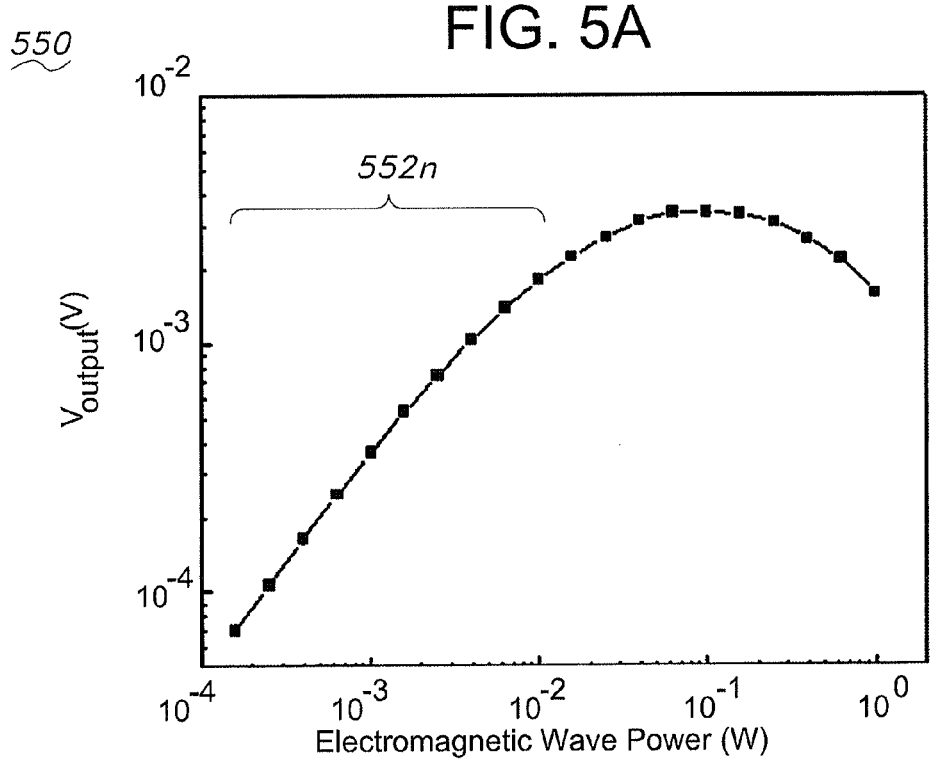
FIG. 5B is a graph of the voltage response as a function of electromagnetic wave power density of an exemplary embodiment of the system of FIG. 5A.

System 500 detects electromagnetic waves based on the voltage measured by detector 512. As described above, system 500 may be configured to obtain information about the electromagnetic wave, such as frequency and/or power, where such properties of the wave are proportional to the voltage generated across devices 502a-502c and measured by detector 512. In an exemplary embodiment, each device 502a-502c has a region in which the voltage across the device 502a-502c is linearly proportional to the power of the received electromagnetic wave. FIG. 5B is a graph 550 of the voltage response across an exemplary device $502n$ ($V_{output}$) as a function of the power of the electromagnetic wave, where n represents any of devices 502a-502c. Graph 550 illustrates that exemplary device $502n$ has a region of linearly proportional voltage response $552n$. Linear response range $552n$ covers approximately 20-30 decibels of the electromagnetic wave's power spectrum. Above this range $552n$, device $502n$ does not produce output voltage linearly proportional to electromagnetic wave power. The voltage across device $502n$ due to an electromagnetic wave in the non-linear range may be less useful for detecting or obtaining information about the electromagnetic wave. Accordingly, the useful range of electromagnetic wave detection for a single exemplary device $502n$ may be limited to approximately 20-30 decibels.

System 500 may increase this range of electromagnetic wave detection through the use of multiple devices 502a-502c coupled to receiver 516. Receiver 516 receives electromagnetic waves from source 514 and transmits the waves to devices 502a-502c. In an exemplary embodiment, receiver 516 is a cascading coplanar waveguide having three sections 518a-518c. However, receiver 516 may be any suitable waveguide or antenna employing cascading circuits for receiving an electromagnetic wave from source 514 and transmitting it to devices 502a-502c. Additionally, receiver 516 may have any number of sections 518, e.g., corresponding to the number of devices 502. Each section 518a-518c is coupled to a corresponding device 502a-502c in order to focus the magnetic field portion of the received electromagnetic wave on the corresponding device. Specifically, the magnetic field portion of the received electromagnetic wave may be inversely proportional to the width of a section $518n$ of the receiver 514. Accordingly. sections 518a-518c of receiver 516 are configured such that the power density of a received electromagnetic wave increases as the electromagnetic wave cascades, or passes from a larger section to a smaller section.

For example, section 518a may be configured to have a width of 100 μm and section 518b may be configured to have a width of 10 μm. In this configuration, an electromagnetic wave in section 518a may have a power density one hundred times less than the same electromagnetic wave in section 518b. Accordingly, if the electromagnetic wave has a power above the linear response range 552b of device 502b, the wave's power density will be 20 decibels less in section 518a, and may fall within the linear response range 552a of device 502a.

Configuration of receiver 516 with cascading sections effectively increases the range of electromagnetic wave detection of system 500 by combining the linear response ranges of devices 502a-502c. As noted above, the linear response range of system 500 may be optimized by using any number of devices 502 in conjunction with receiver 516. Where the electromagnetic wave falls within the linear response range of only one device $502n$, a switch 520 may be employed to allow detector 512 to measure the voltage across only that device $502n$.

System 500 may also be configured to determine characteristics of the electromagnetic wave based on the voltage measured by detector 512. System 500 may be used to determine the frequency and/or power of the received electromagnetic wave using the steps described above with respect to system 300. Similarly, system 500 may be configured as an electromagnetic wave demodulator using the steps described above with respect to system 300.

Figure 6A:
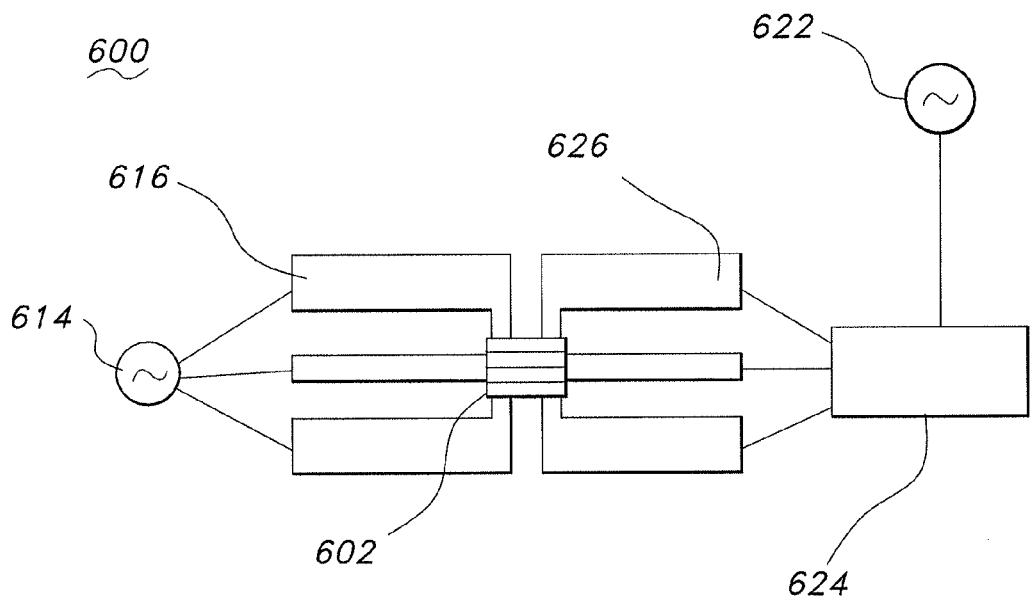
FIG. 6A is a diagram depicting an exemplary system for detecting an electromagnetic wave in accordance with yet another aspect of the present invention.

FIG. 6A depicts an exemplary system 600 for detecting an electromagnetic wave in accordance with yet another aspect of the present invention. System 600 is further configured to detect a phase of received electromagnetic waves. As a general overview, system 600 includes a device 602, a current source (not shown), a detector (not shown), an electromagnetic wave source 614, a receiver 616, a reference wave source 622, a phase tuner 624, and a reference wave receiver 626. Additional details of system 600 are provided below.

Device 602 is a spintronic device substantially as described above. The fixed magnetization direction and initial unfixed magnetization direction of device 602 are configured to be parallel or antiparallel, as described above. The impedance of device 602 may be changed by exposure to an electromagnetic wave. System 600 includes a current source (not shown) which creates a current through device 602, thereby creating a voltage across device 602. System 600 further includes a detector (not shown) for measuring the voltage across device 602. System 600 may detect an electromagnetic wave based on a change in the impedance of device 602 which is reflected in the voltage measured by the detector. Electromagnetic wave source 614 emits electromagnetic waves as described above. Receiver 616 receives electromagnetic waves from source 614 and transmits them to device 602.

Reference wave source 622 emits a reference electromagnetic wave. In an exemplary embodiment, reference wave source 622 is any frequency-tunable electromagnetic wave source. Reference wave source 622 emits a reference electromagnetic wave tuned to the same frequency as the received electromagnetic wave from source 614. In an alternative embodiment, the reference wave can be obtained by splitting the received electromagnetic waves from source 614, e.g. as in conventional vector network analyzers. In this embodiment, reference wave source 622 may be omitted. A suitable reference wave source will be understood by one of skill in the art from the description herein.

Phase tuner 624 adjusts the phase of the reference electromagnetic wave from reference source 622. In an exemplary embodiment, phase tuner 624 receives the reference electromagnetic wave from reference source 622. Phase tuner adjusts the phase of the reference electromagnetic wave and transmits the wave to reference wave receiver 626. A suitable phase tuner will be understood by one of skill in the art from the description herein.

Reference wave receiver 626 receives the reference electromagnetic waves from phase tuner 624 and transmits them to device 602. In an exemplary embodiment, reference wave receiver is a waveguide or antenna of substantially the same form as receiver 616.

System 600 may detect the frequency or power of a received electromagnetic wave as described above. Additionally, system 600 may detect a phase of the received wave. In an exemplary embodiment, system 600 detects the frequency of a received electromagnetic wave from source 614. Reference electromagnetic wave source 622 is then tuned to emit a reference electromagnetic wave having the same frequency as the received wave from source 614. Phase tuner 624 sweeps the phase of the reference wave from 0° to 360°. Reference wave receiver 626 receives the reference wave from phase tuner 624 and transmits the wave to device 602. The detector of system 600 measures the voltage across device 602 as the phase of the reference wave is swept.

Figure 6B:
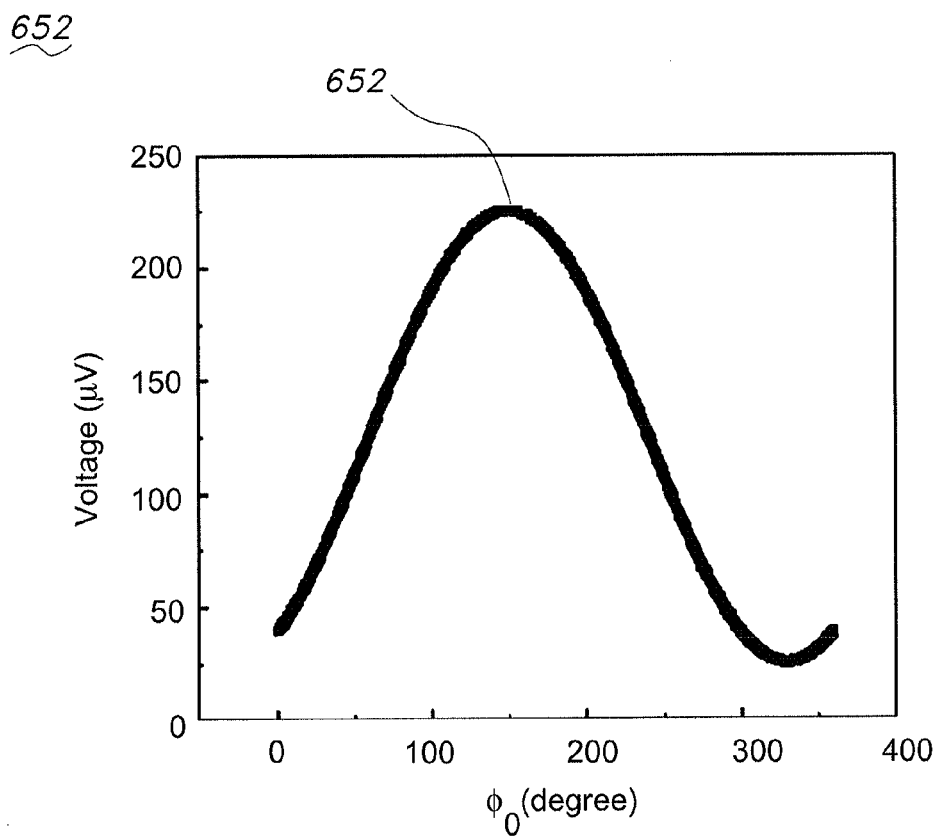
FIG. 6B is a graph of the output voltage of an exemplary embodiment of the system of FIG. 6A.

FIG. 6B is a graph 650 of the voltage measured across exemplary device 602 in accordance with an aspect of the present invention. Graph 650 depicts the measured voltage corresponding to one sweep of the phase of the reference wave from 0° to 360°. Where the phase of the received wave and the reference wave are the same, the measured voltage reaches a maximum value. Accordingly, peak 652 in the measured voltage corresponds to an area where the detected wave from electromagnetic wave source 614 and the reference wave for the reference wave from reference electromagnetic wave source 622 have the same phase. Accordingly, system 600 may determine the phase of the received wave by noting the phase of the reference wave at the point during the phase sweep where a voltage peak is detected.

Referring back to FIG. 6A, system 600 may further be configured for use as an electromagnetic wave vector network analyzer. The power of the received electromagnetic wave may be determined by system 600 based on proportionality with the measured voltage, as described above. Additionally, the phase of a received electromagnetic wave may be determined by system 600 using the above steps. Configuration of system 600 as a vector network analyzer would be understood by one of ordinary skill in the art. Alternatively, system 600 could be configured as a spectrum analyzer. As described, the measured voltage across device 602 varies by phase only when the reference electromagnetic wave has the same frequency as the receive electromagnetic wave. Accordingly, the frequency of the received electromagnetic wave may be determined by tuning the frequency of reference electromagnetic wave source 622 until a phase-dependent voltage is measured, indicating that reference wave source 622 and received wave source 614 are emitting at the same frequency. Configuration of system 600 as a spectrum analyzer would thereby be understood to one of ordinary skill in the art.

Figure 7A:
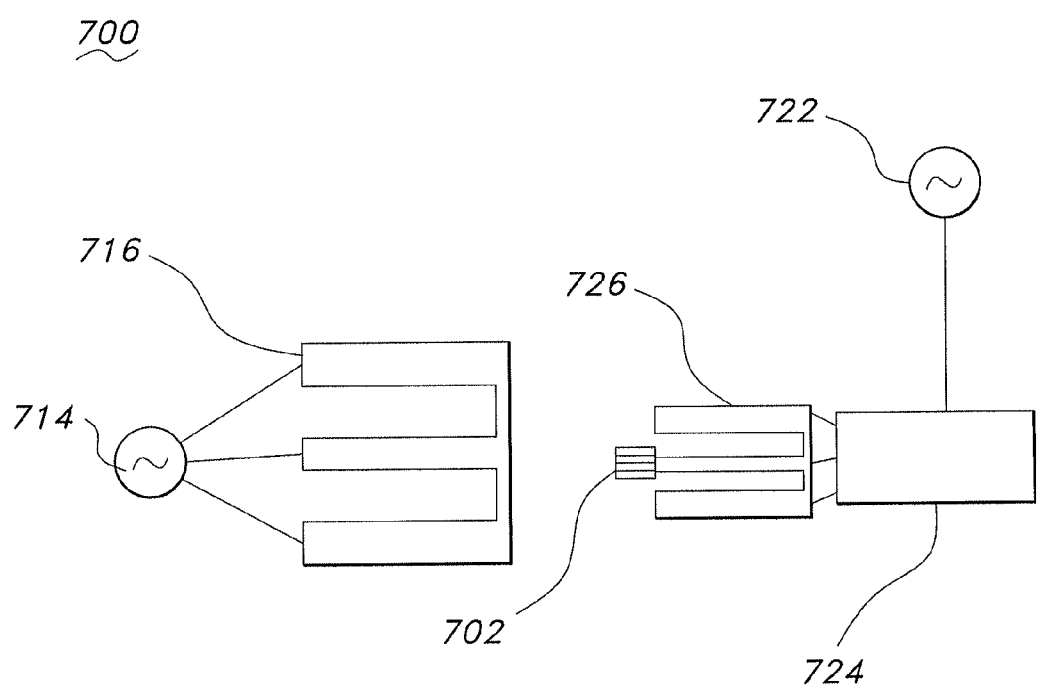
FIG. 7A is a diagram depicting another exemplary system for detecting an electromagnetic wave in accordance with an aspect of the present invention.

FIG. 7A depicts another exemplary system 700 for detecting an electromagnetic wave in accordance with an aspect of the present invention. System 700 is also configured to detect a phase of received electromagnetic waves. As a general overview, system 700 includes a device 702, a detector (not shown), an electromagnetic wave source 714, a receiver 716, a reference wave source 722, a phase tuner 724, and a reference wave receiver 726. Additional details of system 700 are provided below. It will be understood that phase tuner 724 may not be necessary for phase detection when a field swept ferromagnetic resonance profile is obtained, as would be understood by one of ordinary skill in the art from the description herein.

Device 702 is a spintronic device substantially as described above. The fixed magnetization direction and unfixed magnetization direction of device 702 are configured to be perpendicular, as described above. The impedance of device 702 may be changed by exposure to an electromagnetic wave. System 700 further includes a detector (not shown) for measuring the induced voltage across device 702. System 700 may detect an electromagnetic wave based on a change in the impedance of device 702 which is reflected in the voltage measured by the detector. Electromagnetic wave source 714 emits electromagnetic waves as described above.

Receiver 716 receives electromagnetic waves from source 714. In an exemplary embodiment, receiver 716 is a shorted coplanar waveguide. However, receiver 716 may be any suitable waveguide or antenna. Receiver 716 does not couple directly to device 702. Instead, receiver 716 receives electromagnetic wave from source 714 and then irradiates a magnetic field from this wave. Device 702 is exposed to this irradiated magnetic field, causing a change in the impedance of device 702, as described above.

In an exemplary embodiment, reference wave source 722 emits a reference electromagnetic wave tuned to the same frequency as the received electromagnetic wave from source 714. Phase tuner 724 adjusts the phase of the reference electromagnetic wave and transmits the wave to reference wave receiver 726.

Reference wave receiver 726 receives the reference electromagnetic wave from phase tuner 724. In an exemplary embodiment, reference wave receiver is an open coplanar waveguide. However, reference wave receiver 726 may be any suitable waveguide or antenna. Reference wave receiver 726 focuses an electric field from the reference wave onto device 702. Device 702 receives this electric field, creating a current through device 702.

As described above with reference to system 400, the combination of the change in impedance of device 702 and the induced current in device 702 creates a voltage across device 702. The detector of system 700 then measures this voltage. System 700 may detect the frequency or power of the received magnetic wave as described above using the measured voltage. Additionally, system 700 may detect a phase of the received wave. In an exemplary embodiment, the voltage profile measured by the detector is at least partially dependent on the difference in phase of the magnetic field of the received wave irradiated by receiver 716 and the electric field of the reference wave transmitted by reference wave receiver 726.

Figure 7B:
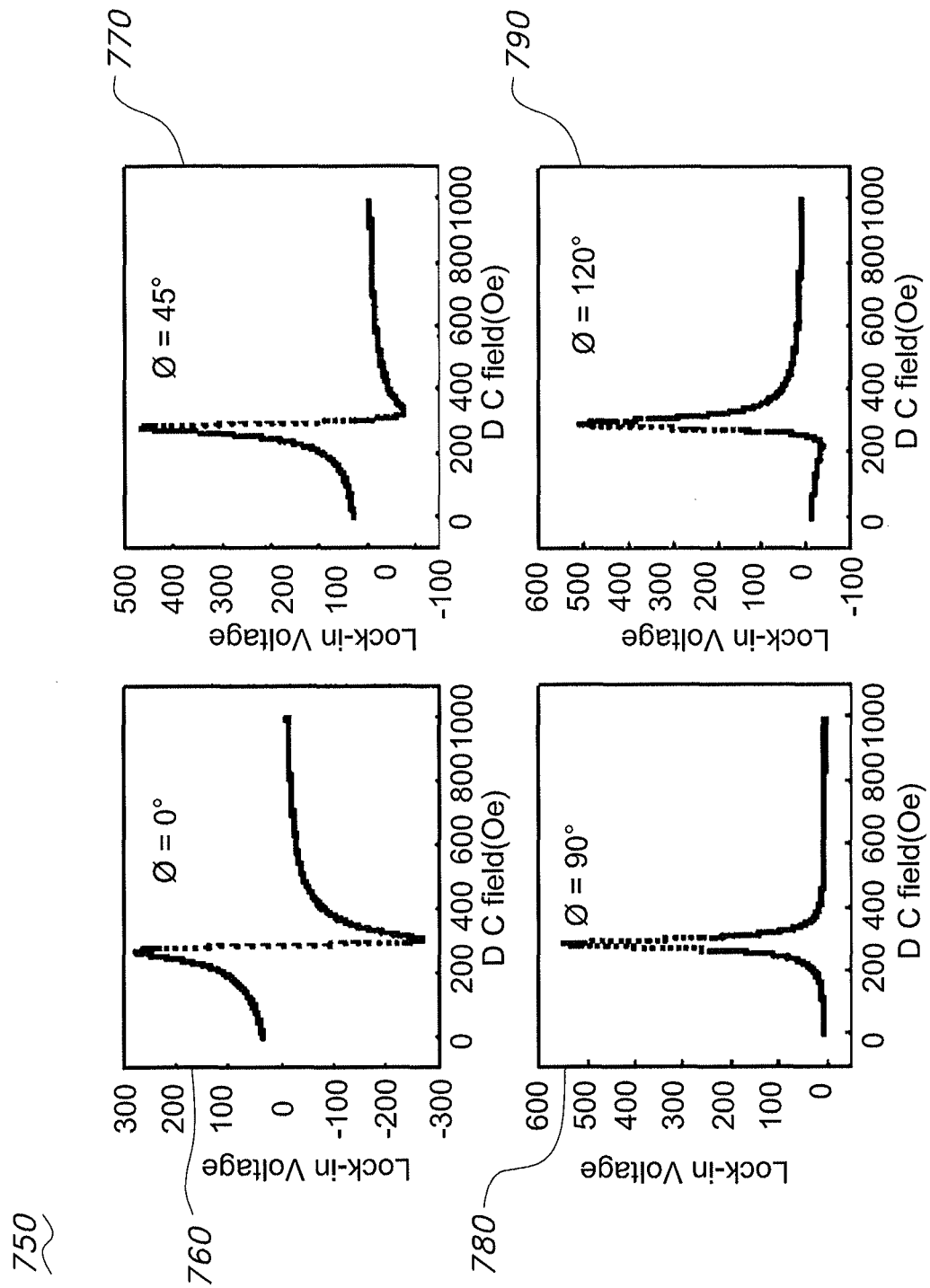
FIG. 7B is a computer image of graphs of the output voltage of an exemplary embodiment of the system of FIG. 7A.

FIG. 7B is a computer image 750 depicting four voltage profiles 760-790 measured across exemplary device 702. FIG. 7B includes graphs 760-790, which include exemplary profiles of measured voltage. Each graph 760-790 corresponds to a phase difference between the magnetic field from the received wave and the electric field from the reference wave. Phase tuner 724 may be used to determine the phase of the reference wave. Accordingly, system 700 may determine the phase of the received wave from source 714 based on the profile of the measured voltage and the phase of the reference wave.

Referring back to FIG. 7A, for the purpose of determining a phase of the received wave, phase tuner 724 may be omitted from system 700 where the phase of the reference wave is known. However, system 700 may further be configured for use as an electromagnetic wave vector network analyzer or a spectrum analyzer, as described above with respect to system 500, using phase tuner 724, for example. Configuration of system 700 as a wave vector network analyzer or a spectrum analyzer will be understood by one of ordinary skill in the art from the description herein.

Although the invention is illustrated and described herein with reference to specific embodiments, the invention is not intended to be limited to the details shown. Rather, various modifications may be made in the details within the scope and range of equivalents of the claims and without departing from the invention. For example, due to the miniaturized dimension of the device, this device may be used for electromagnetic wave imaging with micron/submicron size resolution. It is further contemplated that the device be used as an antenna to receive electromagnetic wave signals. Such a miniaturized antenna could find many applications in communication system such as cellular phones.

What is claimed:

1. A system for use in detecting an electromagnetic wave, comprising:
   a device comprising:
      a first magnetic layer having a fixed magnetization direction;
      a second magnetic layer having an unfixed magnetization direction responsive to the electromagnetic wave; and
      a barrier layer positioned between the first and second magnetic layers;
      wherein the device has an impedance dependent on a relative angle between the fixed magnetization direction and the unfixed magnetization direction, the relative angle initially configured to be one of approximately 0 degrees and 180 degrees;
   an external magnetic field source configured to apply an external DC magnetic field to the device, the external magnetic field source configured to sweep the external DC magnetic field to cause the relative angle to switch from the one of approximately 0 degrees and approximately 180 degrees to the other one of approximately 0 degrees and approximately 180 degrees; and
   a detector configured to measure a change in voltage across the device adjacent a switching region of the relative angle, the change in voltage indicative of the electromagnetic wave.

2. The system according to claim 1, further comprising:
   a receiver for receiving the electromagnetic wave and transmitting the electromagnetic wave to the device.

3. The system according to claim 1, wherein exposure of the device to the electromagnetic wave causes a change in the relative angle between the fixed magnetization direction and the unfixed magnetization direction.

4. The system according to claim 3, wherein the change in the relative angle causes the change in the impedance of the device.

5. The system according to claim 4, wherein the frequency of the change in impedance of the device is proportional to the frequency of the electromagnetic wave.

6. The system according to claim 4, wherein the magnitude of the change in impedance of the device is proportional to the magnetic field portion of the electromagnetic wave.

7. The system according to claim 4, wherein the electromagnetic wave is frequency or amplitude modulated with a signal and wherein:
   the detector measures a voltage across the device corresponding to the signal of the frequency or amplitude modulated electromagnetic wave.

8. The system according to claim 4, further comprising:
   a current source for providing current through the device, the current source being an alternating current source; and
   wherein the detector measures a voltage across the device, such that the voltage measured by the detector corresponds to the electromagnetic wave modulated by the alternating current source.

9. The system according to claim 4, further comprising:
   a current source for providing current through the device, the current source being a direct current source,
   wherein the detector measures a voltage across the device, and
   the direct current amplifies the voltage measured across the device.

10. A system for use in detecting an electromagnetic wave, comprising:
    a device comprising:
       a first magnetic layer having a fixed magnetization direction;
       a second magnetic layer having an unfixed magnetization direction responsive to the electromagnetic wave; and
       a barrier layer positioned between the first and second magnetic layers;
       wherein the device has an impedance dependent on a relative angle between the fixed magnetization direction and the unfixed magnetization direction;
    an external magnetic field source for applying a magnetic field to the device; and
    a detector configured to measure a change in the impedance indicative of the electromagnetic wave, wherein exposure of the device to the electromagnetic wave causes the change in impedance of the device,
    wherein the applied magnetic field causes a peak in the change in the impedance of the device, the peak corresponding to the frequency of the electromagnetic wave.

11. The system according to claim 10, wherein the relative angle is initially configured to be approximately 90 degrees.

12. The system according to claim 11, wherein the detector measures a voltage, across the device and wherein:
    the applied magnetic field causes a change in the voltage across the device, the change corresponding to the relative phase between the electric field and the magnetic field of the electromagnetic wave.

13. The system according to claim 10, wherein the relative angle is initially configured to be one of approximately 0 degrees and approximately 180 degrees and further comprising:
    a current source for providing a current through the device.

14. The system according to claim 13, wherein:
    the applied magnetic field causes the relative angle to switch from the one of approximately 0 degrees and approximately 180 degrees to the other one of approximately 0 degrees and approximately 180 degrees;
    the switching of the relative angle causes a change in a voltage across the device; and
    the detector measures the change in the voltage across the device, the change in voltage being indicative of the power of the electromagnetic wave.

15. The system according to claim 10, wherein the electromagnetic wave is frequency or amplitude modulated with a signal and wherein:
    the detector measures a voltage across the device corresponding to the signal of the frequency or amplitude modulated electromagnetic wave.

16. A system for use in detecting an electromagnetic wave, comprising:
a plurality of devices, each device comprising:
a first magnetic layer having a fixed magnetization direction;
a second magnetic layer having an unfixed magnetization direction responsive to the electromagnetic wave; and
a barrier layer positioned between the first and second magnetic layers;
wherein each device has an impedance dependent on a relative angle between the fixed magnetization direction and the unfixed magnetization direction;
a receiver for receiving the electromagnetic wave and transmitting the electromagnetic wave to the plurality of devices, the receiver having a plurality of sections corresponding to the plurality of devices; the plurality of sections configured such that the electromagnetic wave will have a different power density in each section of the receiver; and
a detector configured to detect a change in the impedance of at least one of the plurality of devices, the change in impedance indicative of the electromagnetic wave.

17. A system for use in detecting a relative phase of a received electromagnetic wave, comprising:
a reference electromagnetic wave generator configured to adjust a frequency of the reference electromagnetic wave;
a device comprising:
a first magnetic layer having a fixed magnetization direction;
a second magnetic layer having an unfixed magnetization direction at least partially dependent on the received electromagnetic wave and the reference electromagnetic wave; and
a barrier layer positioned between the first and second magnetic layers;
wherein the device has an impedance dependent on a relative angle between the fixed magnetization direction and the unfixed magnetization direction; and
a detector configured to detect a change in the voltage across the device indicative of the relative phase of the received electromagnetic wave,
wherein when the frequency of the reference electromagnetic wave is the same as the frequency of the received electromagnetic wave, the detector measures a phase-dependent voltage across the device.

18. The system according to claim 17, further comprising:
a phase tuner for adjusting a phase of the reference electromagnetic wave.

19. The system according to claim 17, wherein the reference electromagnetic wave is generated by splitting the received electromagnetic wave.

20. The system according to claim 19, wherein the magnitude of the change in impedance of the device is proportional to the power of the electromagnetic wave.

21. The system according to claim 17, wherein the reference electromagnetic wave is generated by a reference electromagnetic wave source.

22. The system according to claim 21, wherein the magnitude of the change in impedance of the device is proportional to the power of the electromagnetic wave.

23. A method for detecting an electromagnetic wave, comprising the steps of:
positioning a spintronic device in order to receive the electromagnetic wave, the device having:
a first magnetic layer having a fixed magnetization direction;
a second magnetic layer having an unfixed magnetization direction responsive to the electromagnetic wave; and
a barrier layer positioned between the first and second magnetic layers;
wherein the device has an impedance dependent on a relative angle between the fixed magnetization direction and the unfixed magnetization direction, the relative angle initially configured to be approximately 90 degrees;
determining a change in the impedance of the device; and
detecting a frequency of the electromagnetic wave based on the change in the impedance of the device by:
applying an external DC magnetic field to the device;
sweeping the external DC magnetic field to produce a peak in the change in the impedance of the device; and
detecting the frequency of the electromagnetic wave based on the peak in the change in the impedance of the device.

24. The method according to claim 23, wherein the detecting step comprises:
detecting the power of the electromagnetic wave based on the change in the impedance of the device.

25. The method according to claim 23, wherein the detecting step comprises:
detecting the phase of the electromagnetic wave based on the change in the impedance of the device.

26. The method according to claim 25, further comprising:
detecting a voltage across the device
exposing the device to a reference electromagnetic wave;
sweeping the phase of the reference electromagnetic wave to produce a peak in the change in the voltage of the device; and
detecting the relative phase of the electromagnetic wave based on the peak in the change in the voltage of the device.

27. The method according to claim 25, further comprising:
detecting a voltage across the device;
applying an external magnetic field to the device;
sweeping the external magnetic field applied to the device;
generating a profile in the voltage across the device during the sweeping; and
detecting a relative phase of the electromagnetic wave based on the profile in the voltage across the device.

28. A method for detecting an electromagnetic wave, comprising the steps of:
positioning a spintronic device in order to receive the electromagnetic wave, the device having:
a first magnetic layer having a fixed magnetization direction;
a second magnetic layer having an unfixed magnetization direction responsive to the electromagnetic wave; and
a barrier layer positioned between the first and second magnetic layers;
wherein the device has an impedance dependent on a relative angle between the fixed magnetization direction and the unfixed magnetization direction, the relative angle initially configured to be one of approximately 0 degrees and 180 degrees;
applying an external DC magnetic field to the device;
sweeping the external DC magnetic field to cause the relative angle to switch from the one of approximately 0 degrees and approximately 180 degrees to the other one of approximately 0 degrees and approximately 180 degrees;

determining a change in voltage across the device adjacent to a switching region of the relative angle; and detecting the electromagnetic wave based on the change in the voltage across the device.

29. The method according to claim 28, wherein the detecting step comprises:

detecting the power of the electromagnetic wave based on the change in the voltage across the device.

* * * * *